(12) United States Patent
Wang et al.

(10) Patent No.: US 9,234,940 B2
(45) Date of Patent: Jan. 12, 2016

(54) INTEGRATED FAN-OUT WAFER ARCHITECTURE AND TEST METHOD

(71) Applicant: Taiwan Semiconductor Manufacturing Co., Ltd., Hsin-Chu (TW)

(72) Inventors: Mill-Jer Wang, Hsinchu (TW); Ching-Nen Peng, Hsinchu (TW); Hung-Chih Lin, Hsinchu (TW); Hao Chen, New Tapei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 84 days.

(21) Appl. No.: 14/151,850

(22) Filed: Jan. 10, 2014

(65) Prior Publication Data
US 2015/0198662 A1    Jul. 16, 2015

(51) Int. Cl.
*G01R 31/28* (2006.01)
*G01R 31/3177* (2006.01)
*G01R 31/317* (2006.01)

(52) U.S. Cl.
CPC ...... *G01R 31/3177* (2013.01); *G01R 31/31723* (2013.01)

(58) Field of Classification Search
None
See application file for complete search history.

(56) References Cited

U.S. PATENT DOCUMENTS

| | | | | | |
|---|---|---|---|---|---|
| 5,276,893 | A | * | 1/1994 | Savaria | 714/10 |
| 5,642,054 | A | * | 6/1997 | Pasiecznik, Jr. | 324/755.09 |
| 8,561,001 | B1 | * | 10/2013 | Goel | 716/130 |
| 2009/0148966 | A1 | * | 6/2009 | Cauvet et al. | 438/15 |
| 2011/0202799 | A1 | * | 8/2011 | Pagani | 714/27 |

* cited by examiner

*Primary Examiner* — Daniel McMahon
(74) *Attorney, Agent, or Firm* — Duane Morris LLP; Steven E. Koffs

(57) ABSTRACT

A fan-out wafer comprises a first IC die having at least a first boundary scan cell (BSC) and a second BSC. The first BSC is coupled to a first demultiplexer. The second BSC is coupled to a first pad. A second IC die has at least a third BSC coupled to a second demultiplexer, and a second pad connected to the first pad. A first master path connects the first demultiplexer to the second demultiplexer. A first slave path connects the first demultiplexer to the second demultiplexer. The first pad and second pad are located between the first master path and the first slave path.

20 Claims, 11 Drawing Sheets

US 9,234,940 B2

INTEGRATED FAN-OUT WAFER ARCHITECTURE AND TEST METHOD

FIELD

This disclosure relates to semiconductor fabrication generally, and more specifically to an architecture and test method for an integrated fan-out (InFO) wafer.

BACKGROUND

In an Integrated fan-out (InFO) wafer, a plurality of dies are embedded in a material (such as molding compound), at two or more locations horizontally or vertically separated from each other. Interconnects between dies are formed in one or more redistribution layers (RDL) above the dies. Using this technology, copper interconnects formed after the exposure of on-chip aluminum pads, known as post-passivation interconnects (PPI), allow signals to fan out to regions larger than the silicon die footprint. I/O's can be redistributed to the fan-out region outside of the silicon die footprint for increased pin count at the package or wafer level. Passive devices such as inductors and capacitors can be formed over the molding compound for lower substrate signal loss and higher electrical performance. A smaller form factor leads to better thermal behavior and hence a lower operating temperature for the same power budget, or alternatively, faster circuit operation for the same temperature profile.

DETAILED DESCRIPTION

Figure 1:
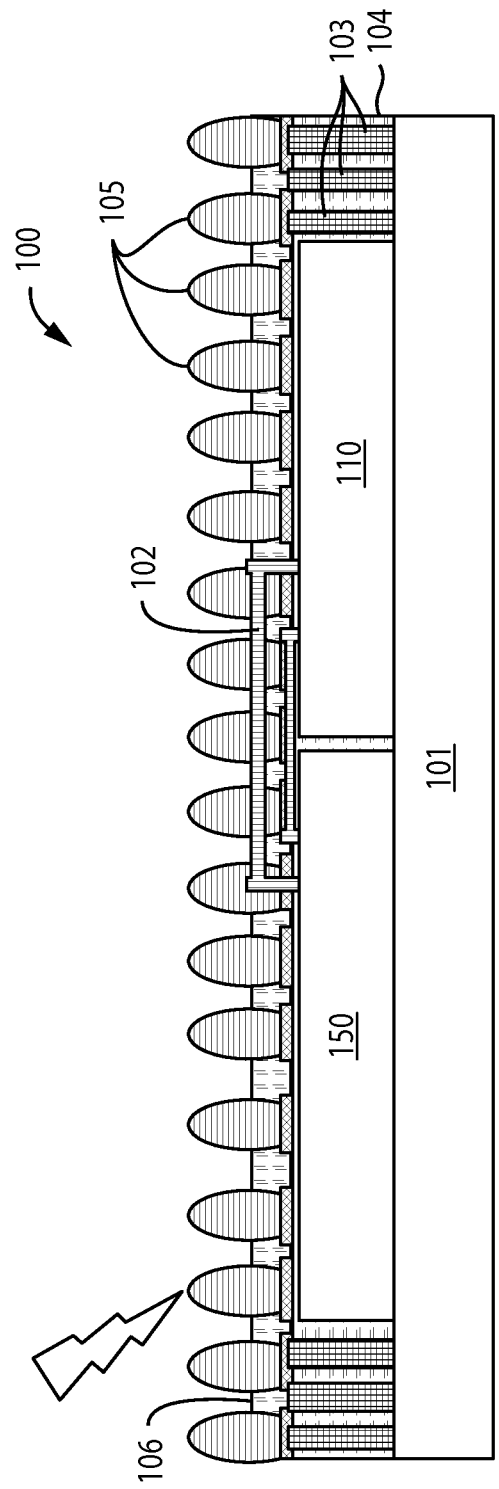
FIG. 1 is a cross-sectional view of an InFO wafer according to some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

This disclosure provides an effective and efficient test and repair method for InFO wafer level chip scale package technology. The method can be used for verification before mass production.

InFO technology introduces a variety of technical challenges, including RDL line width as fine as 2 um, RDL line pitch as fine as 4 um, small pads (e.g., 30 um×30 um) to connect RDL lines, TIV (Thru InFO Via) having a cross section 250 um×250 um, and TIV pitch: 400 um. These dimensions are expected to shrink with future technology nodes.

FIG. 1 is a cross sectional view of an InFO wafer 100. The InFO wafer 100 has a plurality of integrated circuit (IC) dies 110, 150. Dies 110 and 150 do not need to be fabricated using the same technology as either other, and need not have same function. Dies 110 and 150 can include any combination of logic, high speed, RF or memory circuits, for example. Although FIG. 1 only shows two dies, the InFO wafer 100 can include any number of dies, and the structures and techniques described herein can also be used for interconnects among any number of additional dies.

The dies 110, 150 are embedded in a fan-out material 104 such as a molding compound. A plurality of through-InFO-vias (TIV) 103 provide connections between conductors on the top surface of the dies 110, 150 and the back surface of the dies. During fabrication, the dies can be mounted on a carrier substrate 101, which can be glass, for example. Subsequently, the carrier 101 can be removed and another device (e.g., a memory die) can be mounted to the fan-out wafer 100.

At least one redistribution layer (RDL) 106 is formed above the dies 110, 150. In some embodiments, a plurality of RDL layers are included. Interconnections 102 between dies are formed in the RDL layers. These interconnections 102 are discussed further below. Additionally, the RDL layers can be used to increase the pitch between adjacent I/O pins of the final package. A plurality of solder bumps or balls 105 are provided for connecting to a package substrate or printed circuit board.

One or more RDL interconnections 102 can fail due to process variations. This disclosure provides a test and repair architecture and method for InFO cross die interconnects, which allows dies 110 and 150 to communicate normally even if there is a failure. Some embodiments of this architecture provide both quality checks and a redundant path design for yield improvement.

In some embodiments, a staggered pad array design minimizes area overhead and pad pitch. Each primary routing path (referred to herein as the "master" path), such as RDL interconnect paths between dies, has a corresponding redundant path (referred to herein as the "slave" path). To provide robust repair capability, in some embodiments, the slave paths are designed to be distant from the corresponding master path to reduce the chance of both the master path and slave path failing at the same time. For example, a short circuit due to a contamination particle contacting the master path and another line adjacent to the master path will not also short out the slave path corresponding to that master path.

Figure 2:
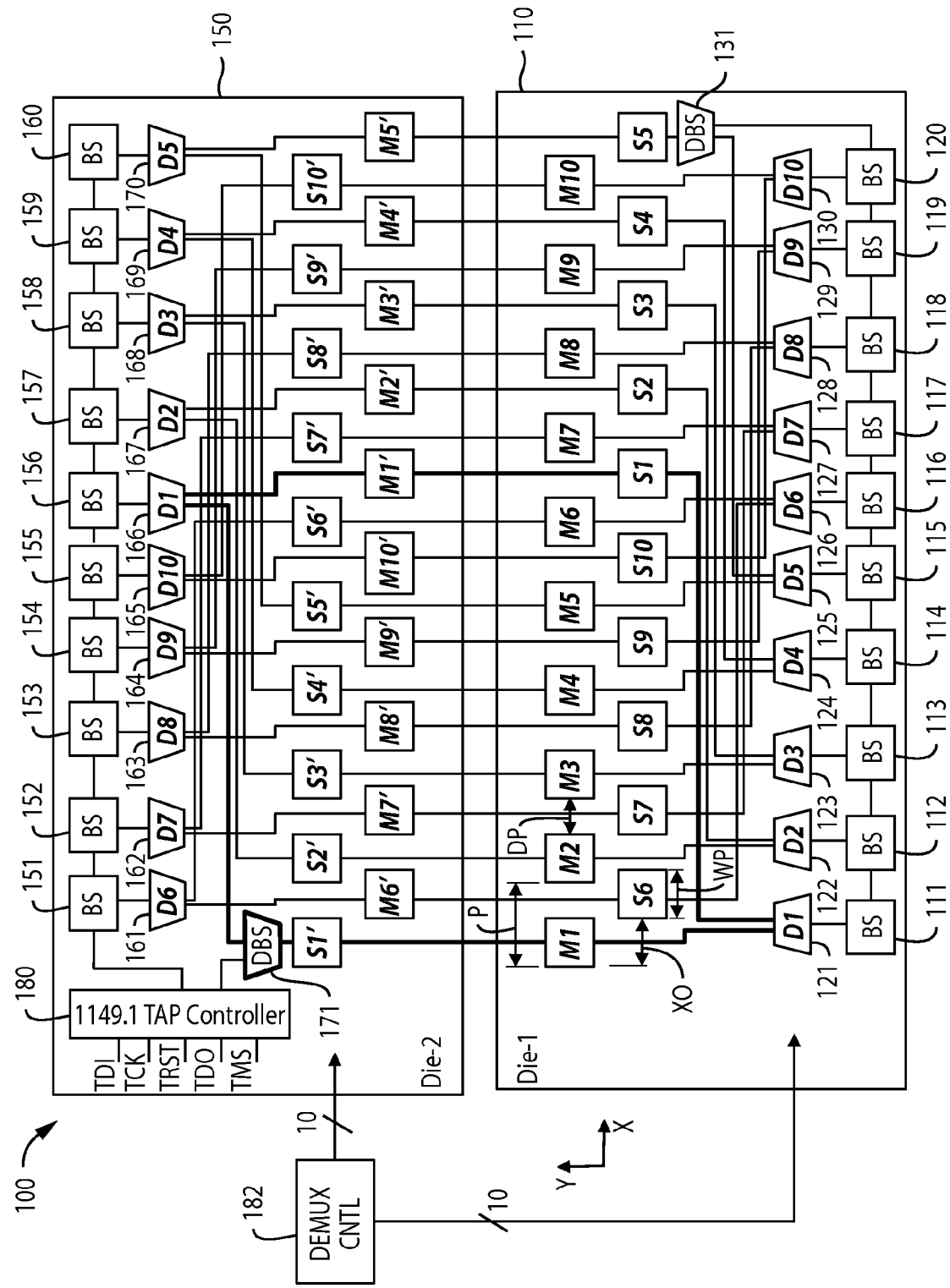
FIG. 2 is a plan view showing an embodiment of an inter-die interconnect architecture, with one master path and corresponding slave path highlighted.

FIG. 2 is a schematic plan view of the InFO wafer 100 of FIG. 1. The example of FIG. 2 has 10 interconnections between IC die 110 and IC die 150. To permit boundary scan testing according to the JTAG IEEE 1149 protocol, each die has a respective boundary scan cell (BSC) for each respective interconnection. Thus, die 110 has BSC 111-120, and die 150 has BSC 151-160. One of the dies (in this example, die 150) has an 1149.1 TAP controller 180 with five serial terminals TDI, TCK, TRST, TDO and TMS for inputting data to the BSC 151-160 of die 150 and receiving data from the BSC 111-120 of die 110. BSC 111-120 are connected to each other in series, and BSC 151-160 are connected to each other in series. Each BSC has storage elements, such as registers, flip-flops, or the like (not shown). Thus, data can be input serially through the TDI terminal to BSC 151 and shifted in subsequent cycles through each of BSC 152-160. Similarly, data can be shifted from BSC 120 through each of BSC 119-111. Each die has a plurality of probe pads (Mi, Si, Mi' and Si'), referred to below as "pads" for brevity.

In FIG. 2, the "master paths" proceed from a master pad to a corresponding slave pad. For example a master path from demultiplexer 121 to demultiplexer 156 proceeds from master pad M1 to slave pad S1'. The "slave paths" proceed from a slave pad to a corresponding master pad. For example, a slave path from demultiplexer 121 to demultiplexer 156 proceeds from slave pad S1 to slave pad M1'.

For ease of reference, the interconnecting paths between pads in FIG. 2 are referred to herein by the IDs of the connected pads. Thus the path from pad M1 to pad S1' is referred to as master path M1-S1'. The remaining master paths are referred to as M2-S2', M3-S3-, M4-S4', M5-S5', M6-S6', M7-S7', M8-S8', M9-S9' and M10-S10'. Similarly, the corresponding slave paths are referred to as S1-M1', S2-M2', S3-M3', S4-M4', S5-M5', S6-M6', S7-M7', S8-M8', S9-M9', and S10-M10'. The connecting paths can be implemented in a plurality of redistribution layers.

A path connecting BSC 160 to BSC 120 is provided by way of demultiplexer D5 170, pad M5', pad S5, and demultiplexer 131. From BSC 111, the data can be output to the TDO terminal of the controller 180 by way of a master path including demultiplexer D1 121, pad M1, pad S1', and demultiplexer 171.

Each BSC 111-120 can transmit data to, or receive data from, a respective demultiplexer 121-130. Each BSC 151-160 can transmit data to, or receive data from, a respective demultiplexer 161-170. Each demultiplexer 121-130, 161-170 has a control input from the demultiplexer controller 182 for selecting either a master path having a line connected to a respective master pad M1-M10, M1'-M10', or a slave path having a line connected to a respective slave pad S1-S10, S1'-S10'. The BSC can be used to test the interconnections between dies in the RDL layers, and to diagnose any failures.

FIG. 2 shows an example of the master and slave paths between a single BSC 111 on die 110 and a single BSC 156 on die 150. In FIG. 2, for ease of example, this single master path/slave path pair is highlighted. To transmit data from BSC 111 to BSC 156, demultiplexers D1 121 and D1 166 can be switched to the primary (master) path, including master pad M1, slave pad S1', and demultiplexer 171. Alternatively, to transmit data from BSC 111 to BSC 156, demultiplexers D1 121 and D1 166 can be switched to the slave path, including slave pad S1 and master pad M1'. The interconnect lines of the master and slave paths are distant from each other. In some embodiments, the interconnect lines of the master and slave paths are separated from each other by at least one pair of pads (e.g., S6-M6', M2-S2', S7-M7', M3-S3', S8-M8', M4-S4', S9-M9', M5-S5', S10-M10', or S1-M1') and the interconnect line connecting that pair of pads.

For example, as shown in FIG. 2, in some embodiments, a fan-out wafer 100 comprises a first IC die 110 having at least a first boundary scan cell (BSC) 111 and a second BSC 112. The first BSC 111 is coupled to a first demultiplexer D1 121. The second BSC 112 is coupled to a first pad M2. A second IC die 150 has at least a third BSC 156 coupled to a second demultiplexer D1 166, and a second pad S2' connected to the first pad M2. A first master path M1-S1' connects the first demultiplexer D1 121 to the second demultiplexer D1 166. A first slave path S1-M1' connects the first demultiplexer D1 121 to the second demultiplexer D1 166. The first pad M2 and second pad S2' (and their connecting path M2-S2') are located between the first master path and the first slave path. In this example, several additional pairs of pads, along with their interconnecting paths, are interposed between the primary path M1-S1' and the redundant path S1-M1'. In other embodiments any positive integer number of pad pairs (and their interconnecting path) can be positioned between the master path (e.g., M1-S1') and the slave path (e.g., S1-M1') for any given pair of BSC (e.g., 111, 156).

Each first demultiplexer 121-130 is configurable to select a respective one of the first master path or the first slave path for transmission of a signal from the respective first BSC 111-120 to the respective third BSC 151-160. For example, demultiplexer 122 is configurable to select master path M2-S2' or the slave path S2-M2' for transmission of a signal from the BSC 112 to the BSC 157. Demultiplexer 123 is configurable to select master path M3-S3' or slave path S3-M3' for transmission of a signal from BSC 113 to BSC 158. Demultiplexer 124 is configurable to select master path M4-S4' or slave path S4-M4' for transmission of a signal from BSC 114 to BSC 159. Demultiplexer 125 is configurable to select master path M5-S5' or slave path S5-M5' for transmission of a signal from BSC 115 to BSC 160. Demultiplexer 126 is configurable to select master path M6-S6' or slave path S6-M6' for transmission of a signal from BSC 116 to BSC 151. Demultiplexer 127 is configurable to select master path M7-S7' or slave path S7-M7' for transmission of a signal from BSC 117 to BSC 152. Demultiplexer 128 is configurable to select master path M8-S8' or slave path S8-M8' for transmission of a signal from BSC 118 to BSC 153. Demultiplexer 129 is configurable to select master path M9-S9' or slave path S9-M9' for transmission of a signal from BSC 119 to BSC 154. Demultiplexer 130 is configurable to select master path M10-S10' or slave path S10-M10' for transmission of a signal from BSC 120 to BSC 160. As the demultiplexer controller 182 switches each first demultiplexer D1 121-D10 130 to the corresponding master or slave path, controller 182 also switches each second demultiplexer D1 161-D10 170 to the corresponding master or slave path.

Each second demultiplexer 161-170 on the second die 150 is configurable to select a respective one of the second master path or the second slave path for transmission of a signal from the respective BSC 151-160 to the respective third BSC 111-120. For example, demultiplexer 161 is configurable to select master path M1'-S1 or the slave path S1'-M1 for transmission of a signal from the BSC 151 to the BSC 111. Demultiplexer 162 is configurable to select master path M2'-S2 or the slave path S2'-M2 for transmission of a signal from BSC 113 to BSC 158, etc.

In general, each first master path includes a first master pad M1-M10 on the first die 110 connected to a first slave pad S1-S10 on the second die 150. The first master pad M1-M10 and the first slave pad S1-S10 are connected between the first demultiplexer 121-130 and the second demultiplexer 156-160, 151-155. Each first slave path includes a second slave pad S1-S10 on the first die 110 connected to a second master pad M1'-M10' on the second die 150. The second slave pad S1-S10 and the second master pad M1'-M10' are connected between the first demultiplexer 121-130 and the second demultiplexer 156-160, 151-155.

In general, when one of the BSC 111-120 of die 110 is transmitting data to its corresponding BSC 156-160, 151-155, the demultiplexer controller 182 switches the transmitting demultiplexer 121-130 to use its primary path Mi-Si', where i varies from 1 to 10. In general, when one of the BSC 151-160 of die 150 is transmitting data to its corresponding BSC 116-120, 111-115, the demultiplexer controller 182 switches the transmitting demultiplexer 161-170 to use its primary path Mi'-Si, where i varies from 1 to 10. Thus, each path includes a master pad on one die and a slave pad on the other die.

As shown in FIG. 2, the master pad M1-M10 in the first die 110 are included in a first row of master pads. The slave pads S1-S10 are included in a first row of slave pads on the first die 110. The first row of slave pads S1-S10 is parallel to the first row of master pads M1-M10 Similarly, the master pad M1'-M10' in the second die 110 are included in a second row of master pads. The slave pads S1'-S10' are included in a second row of slave pads on the second die 150. The second row of slave pads S1'-S10' is parallel to the second row of master pads M1'-M10'.

In some embodiments, the master pads and slave pads are staggered. That is, with the row of master pads oriented in the X direction, and the row of slave pads oriented in the same X direction, each slave pad has an X offset XO relative to the nearest master pad. In some embodiments, the offset XO is half the pitch P between adjacent master pads. For example, slave pad S6 can be offset in the X direction from master pad M1 by one half the pitch P between adjacent master pads M1 and M2. In other embodiments, the offset XO can be greater than or less than one half of the pitch P between adjacent master pads. As a result of the offset between the master pads and the slave pads, the distance DP between adjacent master pads (e.g., M1 and M2) can be smaller than the width of the nearest slave pad M6. Similarly, the distance between adjacent slave pads (e.g., S6 and S7) can be smaller than the width of the nearest master pad M2. This adjacent master pads can have an interconnecting line therebetween, and adjacent slave pads can have an interconnecting line therebetween. Adjacent interconnecting lines can have a master pad or a slave pad therebetween. By staggering the row of slave pads relative to the row of master pads, the distance DP between adjacent pads can be reduced, relative to the width W of each pad. The overall length of the row can be reduced.

For example, a first pad M1 is included in a plurality of pads arranged in a row of master pads M1-M10. The row includes a pad M2 adjacent to the first pad M1. A spacing between a closest pair of respective edges of the first pad M1 and the pad M2 is smaller than a width W of the first pad M1 in an X direction extending from the pad M1 to the pad. M2. A first slave pad S1 is included in a plurality of pads arranged in a row of master pads S1-S10. The row includes a pad S2 adjacent to the first pad S1. A spacing between a closest pair of respective edges of the first pad S1 and the pad S2 is smaller than a width W of the first pad S1 in an X direction extending from the pad S1 to the pad. S2.

Thus, as shown in FIG. 2, master pads M1-M10 on the die 110 are connected to the respective slave pads S1'-S10' on the die 150, and master pads M1'-M10' on the die 150 are connected to the respective slave pads S1-S10 on the die 110. This simplifies routing, because each master pad is aligned with a corresponding slave pad on the opposite die. For example, master pad M1 on die 110 is aligned with slave pad S1' on the die 150.

In FIG. 2, the BSC 156-160 are connectable to BSC 111-115, and BSC 151-155 are connectable to BSC 116-120. Thus, the BSC in die 150 are offset by five positions from the corresponding BSC in die 110 (and wrap around). In other embodiments, the BSC in die 150 can be offset by fewer or more than five positions relative to the corresponding BSC in die 110, so long as the master path and slave path for each pair of connected demultiplexers are separated from each other by at least one master and/or slave path corresponding to another pair of connected demultiplexers.

Figure 3:
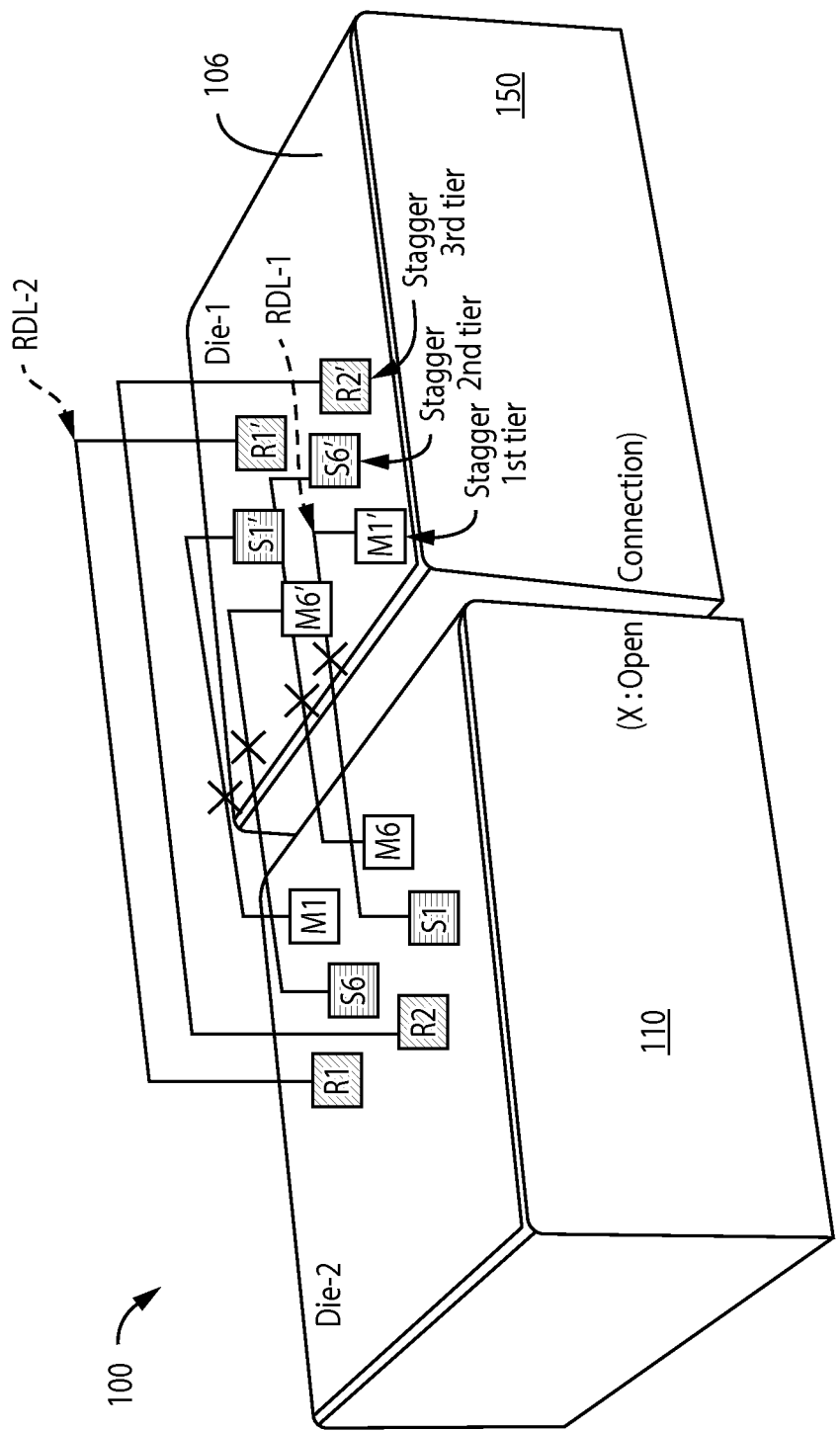
FIG. 3 is schematically shows a set of redundant paths on a second RDL layer of the InFO wafer of FIGS. 1 and 2.

FIG. 3 shows an example in which the InFO wafer has at least two RDL layers 106. In some embodiments, the master paths and slave paths described above are implemented so that the connecting lines between dies 110, 150 are implemented in a first RDL layer, and an additional redundant set of lines are formed in a second RDL layer.

For example, a first redistribution layer RDL-1 having a first conductive line M1-S1' is coupled between a first one of the demultiplexers 121 on the first IC die 110 and a first one of the demultiplexers 156 on the second IC die 150, as described above. A second redistribution layer RDL-2 has a second conductive line R1-R1' coupled between the demultiplexer 121 on the first IC die and demultiplexer 156 on the second IC die 150. In this embodiment, each of the demultiplexers 121-130 and 161-170 is capable of switching among three different lines. In other embodiments having four or more alternative paths per BSC pair, each demultiplexer is capable of switching among that same number of paths.

As also shown in FIG. 3, the pads on each die 110, 150 can be arranged in more than three rows. For example, in FIG. 3, in each die, the master pads are arranged in one row, the slave pads are arranged in a second row, and the redundant pads (R1, R2, R1', R2') are arranged in a third row. In other embodiments (not shown), the pads one each die can be arranged in more than three rows.

In other embodiments, the master paths for one of the dies are all routed through one RDL conductive line layer, and the slave paths for that die are all routed through another RDL conductive line layer.

Figure 4:
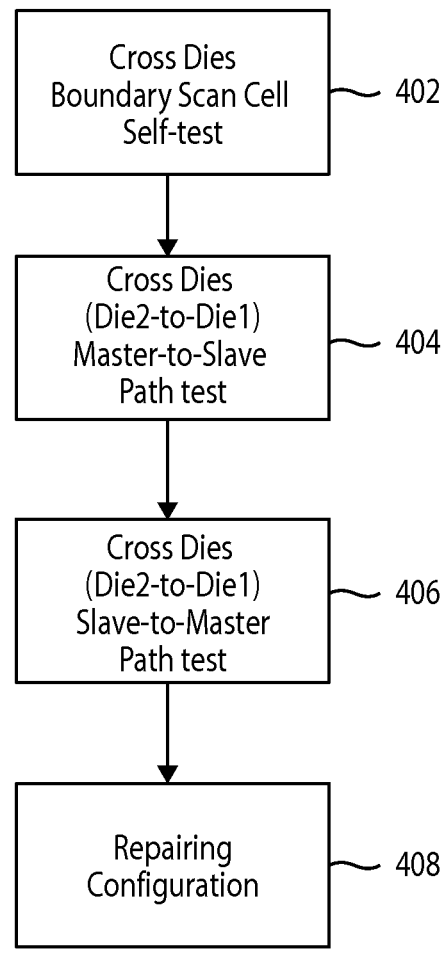
FIG. 4 is a flow chart of a boundary scan method for testing the InFO wafer of FIG. 2.

FIG. 4 is a flow chart of a text method which is performed on the InFO wafer 100. For the purpose of the tests described below, any desired sequence of test data can be used. This series of tests can be performed after fabrication of the cross die interconnects in the RDL layer(s) 106, and can be performed prior to packaging the InFO wafer 100. In other embodiments, the testing and repairing can be performed after packaging.

At step 402, a cross die boundary scan cell self test is performed. This test verifies whether data can be shifted through a loop from input terminal TDI through BSC 151-160 and 130-121, and out of output terminal TDO. This loop is highlighted in FIG. 5.

Figure 5:
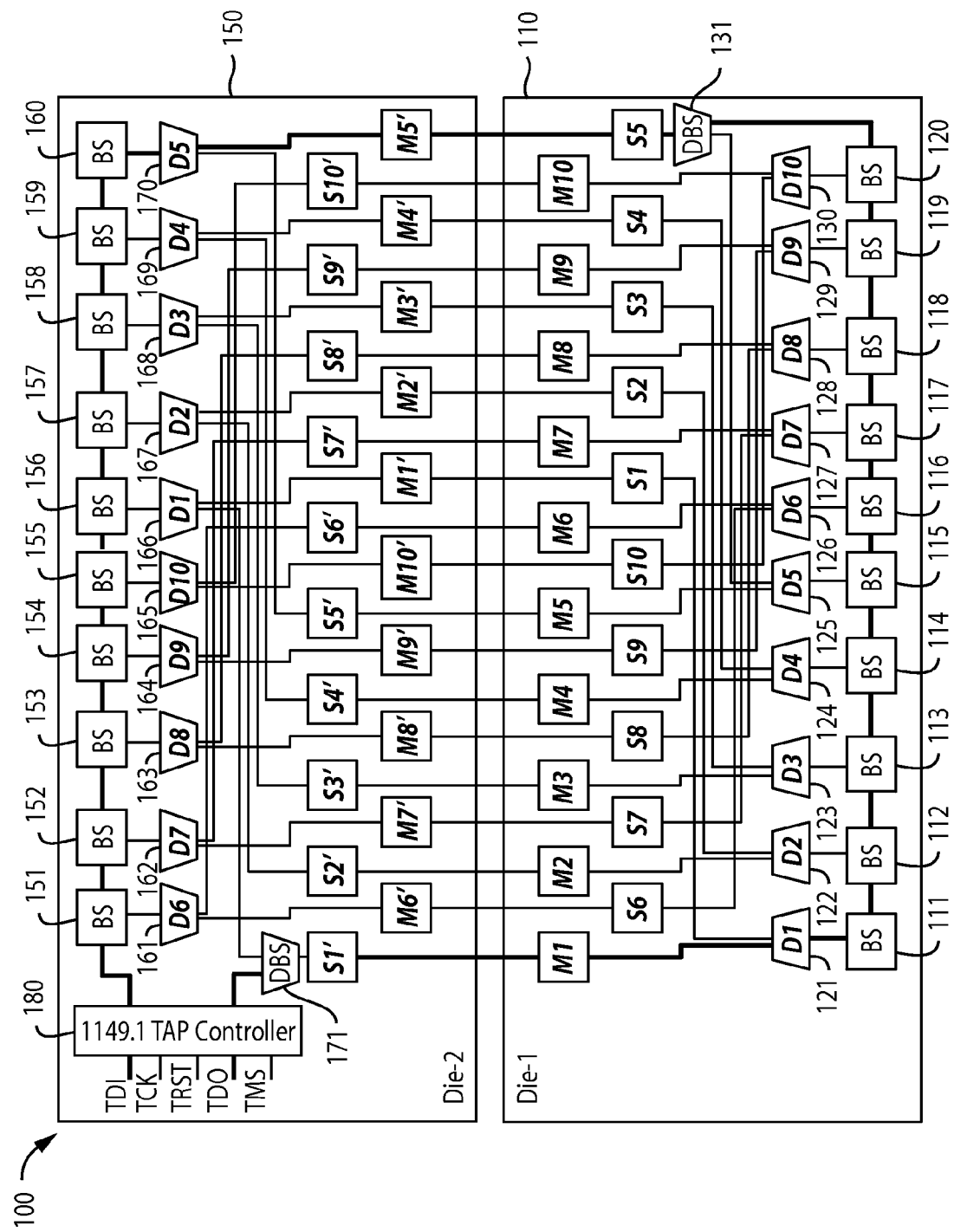
FIG. 5 shows the InFO wafer of FIG. 2, with the demultiplexers switched to perform BSC self test.

Referring to FIG. 5, in each cycle data from TDI is stored in BSC 151, data from BSC 151 is shifted into BSC 152, and so on, till the data in BSC 159 is shifted into BSC 160. The demultiplexer D5 170 is switched to use the master path M5'-S5. Data in BSC 160 is transmitted via path M5'-S5 to the additional demultiplexer 131, which has been switched to output data to BSC 120. Data are switched through the BSC 120-111. The data in BSC 111 is provided to demultiplexer D1 121, which is configured to send the data via path M1-S1' to demultiplexer 171. Demultiplexer 171 has been switched to output data to the output terminal TDO.

Referring again to FIG. 4, at step 404, the cross die master-to-slave paths from die 150 to die 110 are tested. This is shown schematically in FIGS. 6A-6C.

Figure 6A:
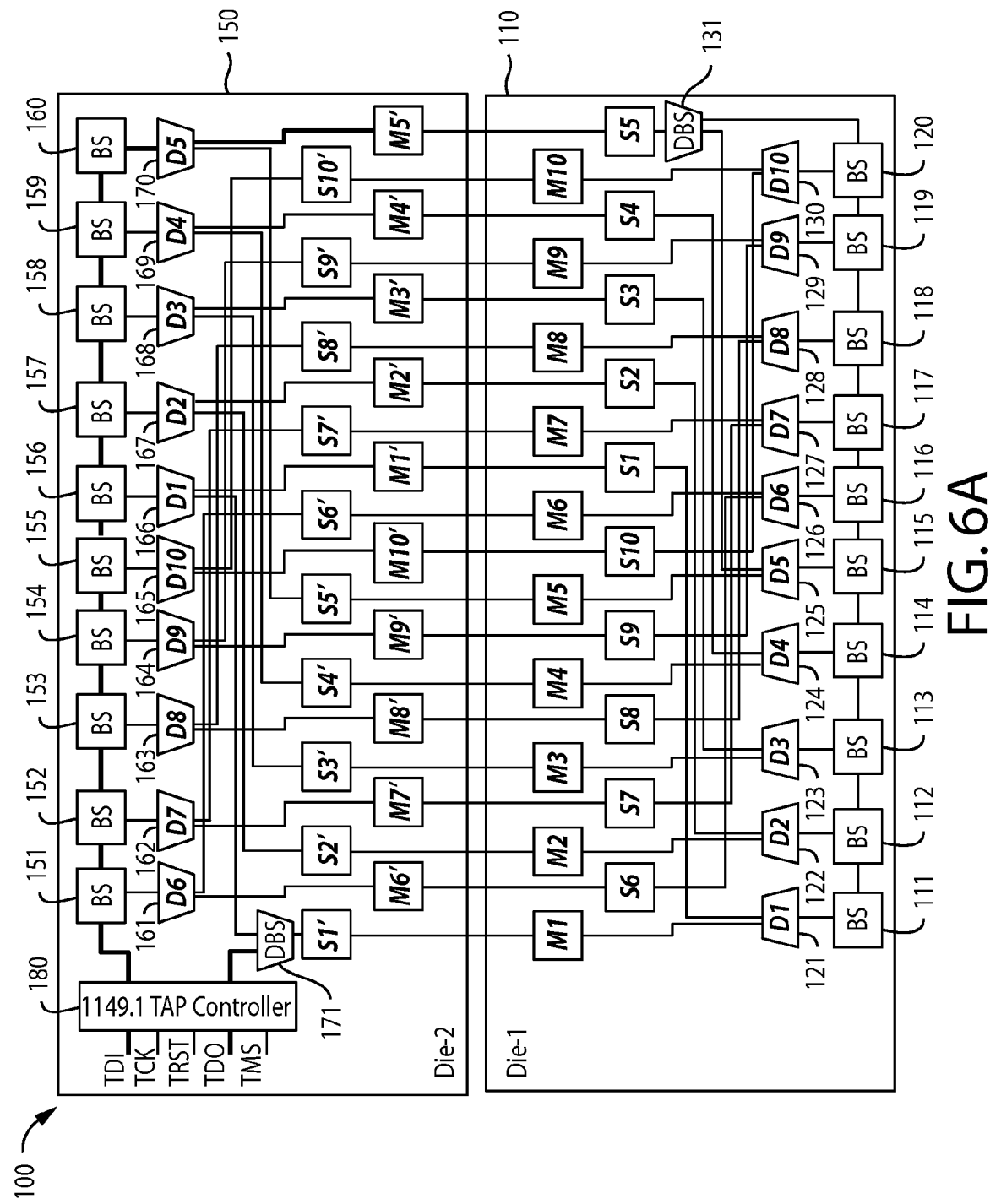
FIGS. 6A-6C shows the InFO wafer of FIG. 2, with the demultiplexers switched to perform a master path test for the die 150.

In FIG. 6A, the test data are shifted from the TDI input terminal through the BSC of die 150, from BSC 151 to BSC 160. After 10 cycles, each BSC 151-160 stores a respective test datum, with the first datum in BSC 160 and the 10th datum in BSC 151.

The demultiplexers 161-170 in die 150 are switched to provide data to the master paths M6-S6, M7'-S7, M8'-S8, M9'-S9, M10'-S10, M1'-S1, M2'-S2, M3'-S3, M4'-S4 and M5'-S5. The demultiplexers 121-130 in die 110 are switched to receive data from their respective slave paths S1-M1', S2-M2', S3-M3', S4-M4', S5-M5', S6-M6', S7-M7', S8-M8', S9-M9', S10-M10'. Additionally, the demultiplexer 131 in die 110 is switched to provide data to demultiplexer 125 (instead of to BSC 120).

Figure 6B:
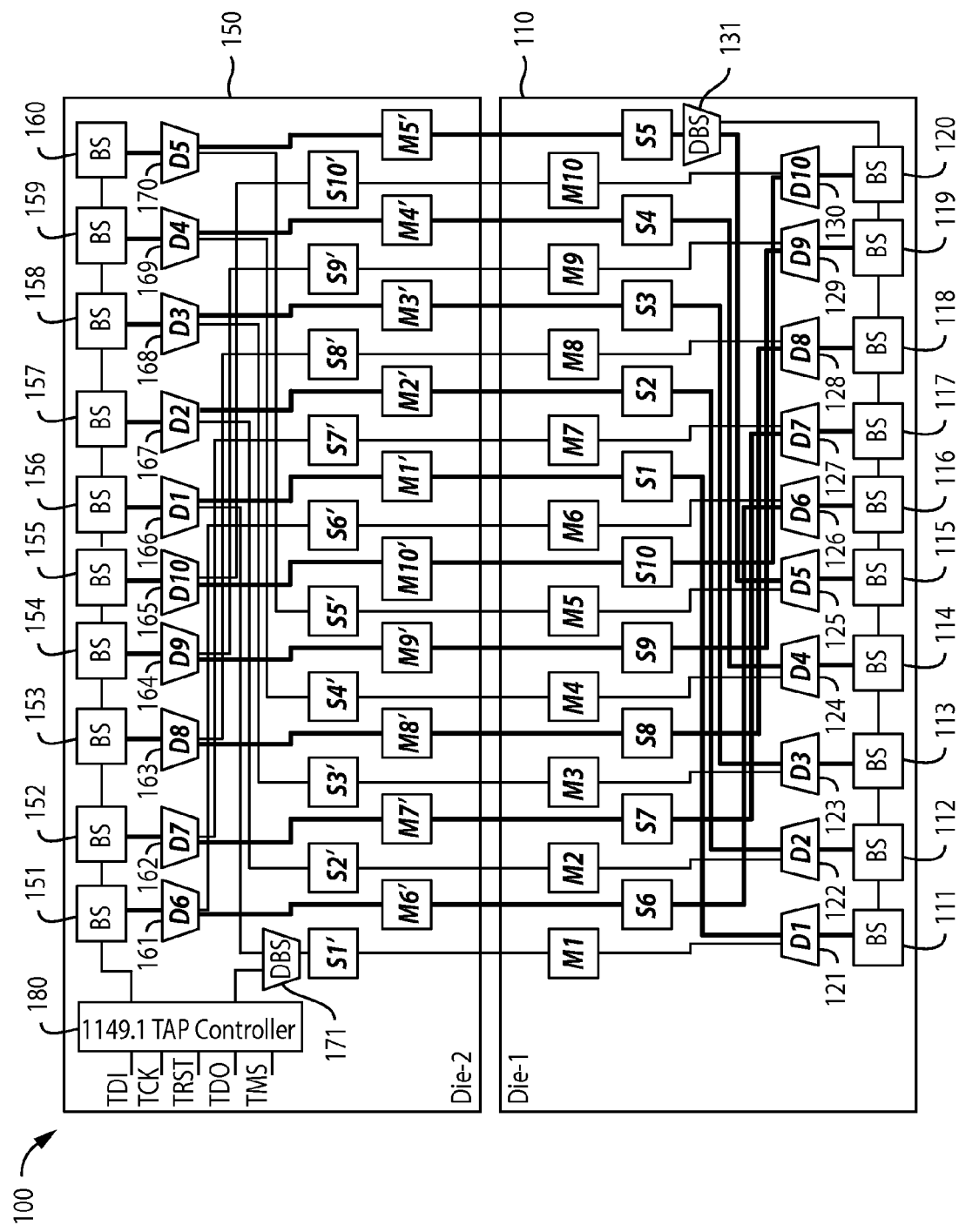

FIG. 6B is highlighted to show the data flow from each BSC 151-160 of die 150 to respective BSC 126-130, 121-125.

Figure 6C:
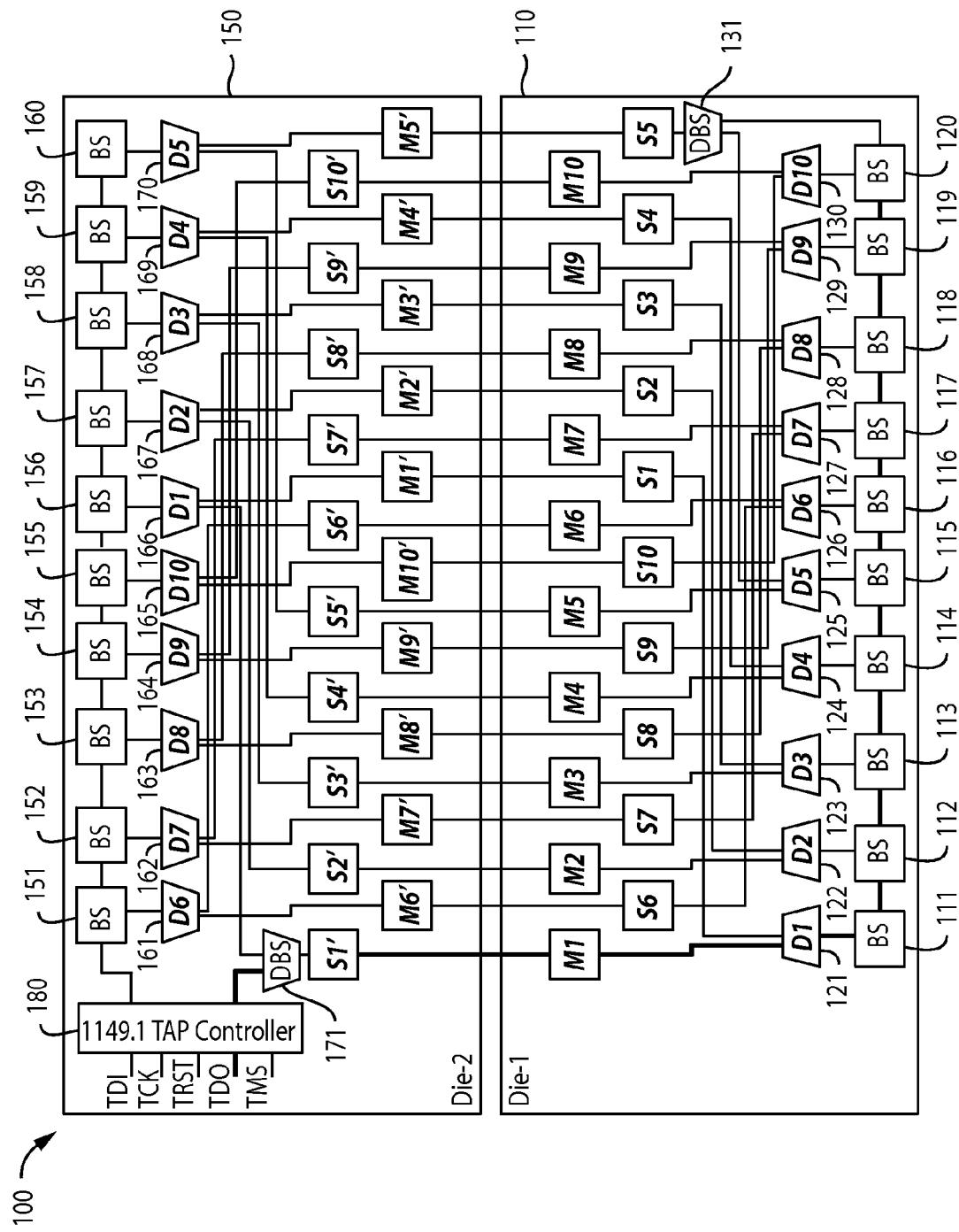

In FIG. 6C the data in BSC 111-120 are shifted out to the output terminal TDO. Demultiplexer D1 121 in die 110 is switched to output data through master path M1-S1' to demultiplexer 171. The demultiplexer 171 is switched to transmit the data to output terminal TDO. The data in the BSC 112-120 are shifted to the left, until the last data (from BSC 120) is shifted out to terminal TDO.

Referring again to FIG. 4, at step 406, the cross die slave-to-master paths from die 150 to die 110 are tested. This test is shown schematically in FIGS. 6A, 7 and 6C.

First, the input data are shifted into BSC 151-160, as described above with respect to FIG. 6A. In FIG. 6A, the test data are shifted from the TDI input terminal through the BSC of die 150, from BSC 151 to BSC 160. After 10 cycles, each BSC 151-160 stores a respective test datum, with the first datum in BSC 160 and the 10th datum in BSC 151.

In this test, the demultiplexers 161-170 in die 150 are switched to provide data to the slave paths S6'-M6, S7'-M7, S8'-M8, S9'-M9, S10'-M10, S1'-M1, S2'-M2, S3'-M3, S4'-M4, S5'-M5. The demultiplexers 121-130 in die 110 are switched to receive data from their respective master paths M1-S1', M2-S2', M3-S3', M4-S4', M5-S5', M6-S6', M7-S7', M8-S8', M9-S9', M10-S10'. Additionally, the demultiplexer 171 in die 150 is switched to receive data from demultiplexer D1 166, and provide the data to demultiplexer D1 121 via path S1'-M1.

Figure 7:
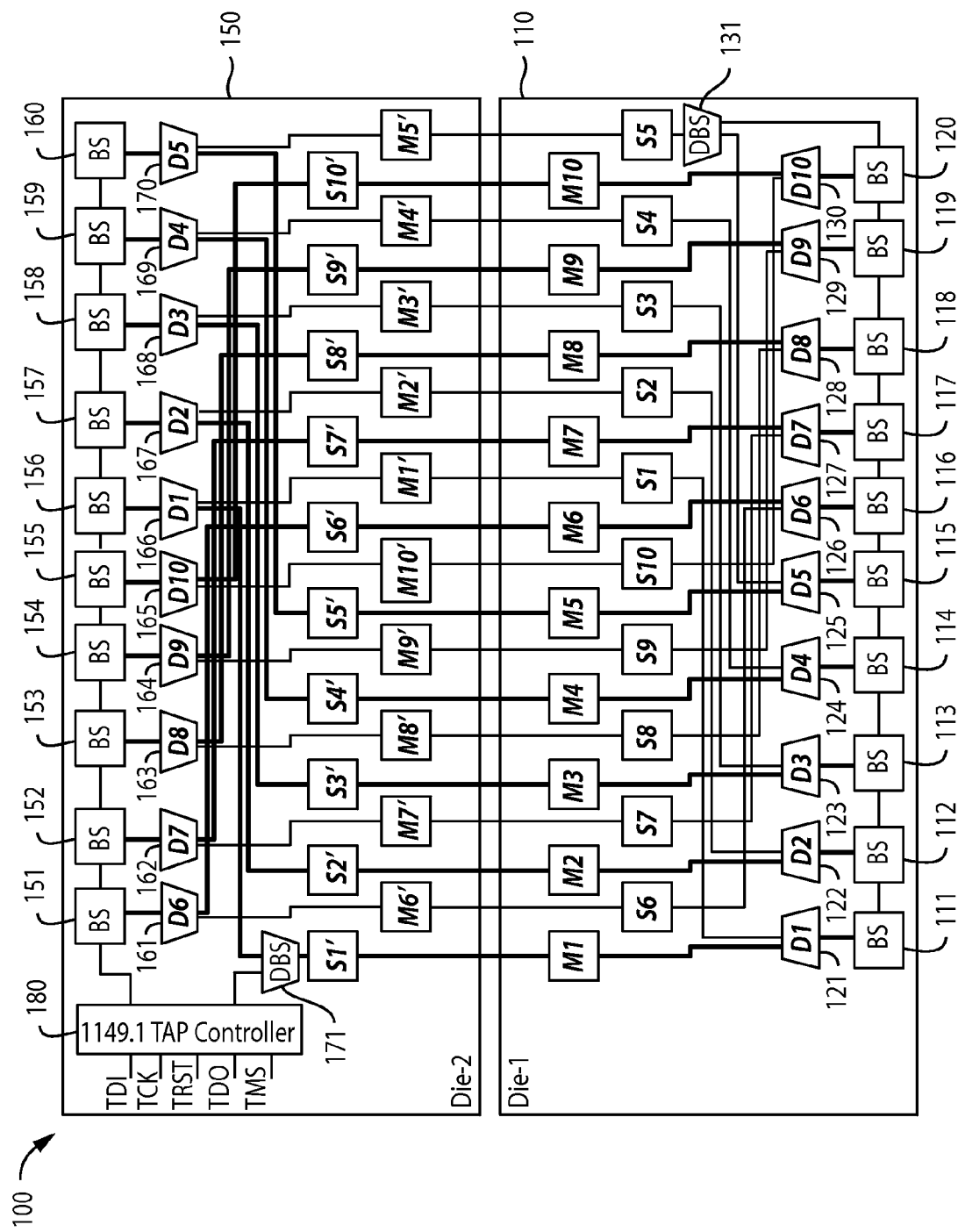
FIG. 7 shows the InFO wafer of FIG. 2, with the demultiplexers switched to perform a slave path test for the die 150.

FIG. 7 is highlighted to show the data flow from each BSC 151-160 of die 150 to respective BSC 126-130, 121-125, by way of the slave paths. At the completion of this step, the data from BSC 151-160 have been transferred to respective BSC 116-120, 111-115.

Referring again to FIG. 6C, once the data have been received by the BSC 111-120, they are shifted out to the output terminal TDO as described above. Demultiplexer D1 121 in die 110 is switched to output data through master path M1-S1' to demultiplexer 171. The demultiplexer 171 is switched to transmit the data to output terminal TDO. The data in the BSC 112-120 are shifted to the left, until the last data (from BSC 120) is shifted out to terminal TDO.

Referring again to FIG. 4, at step 408, if any of the interconnect paths is identified during steps 404 and/or 406 as being failed, a repair is initiated.

Figure 8A:
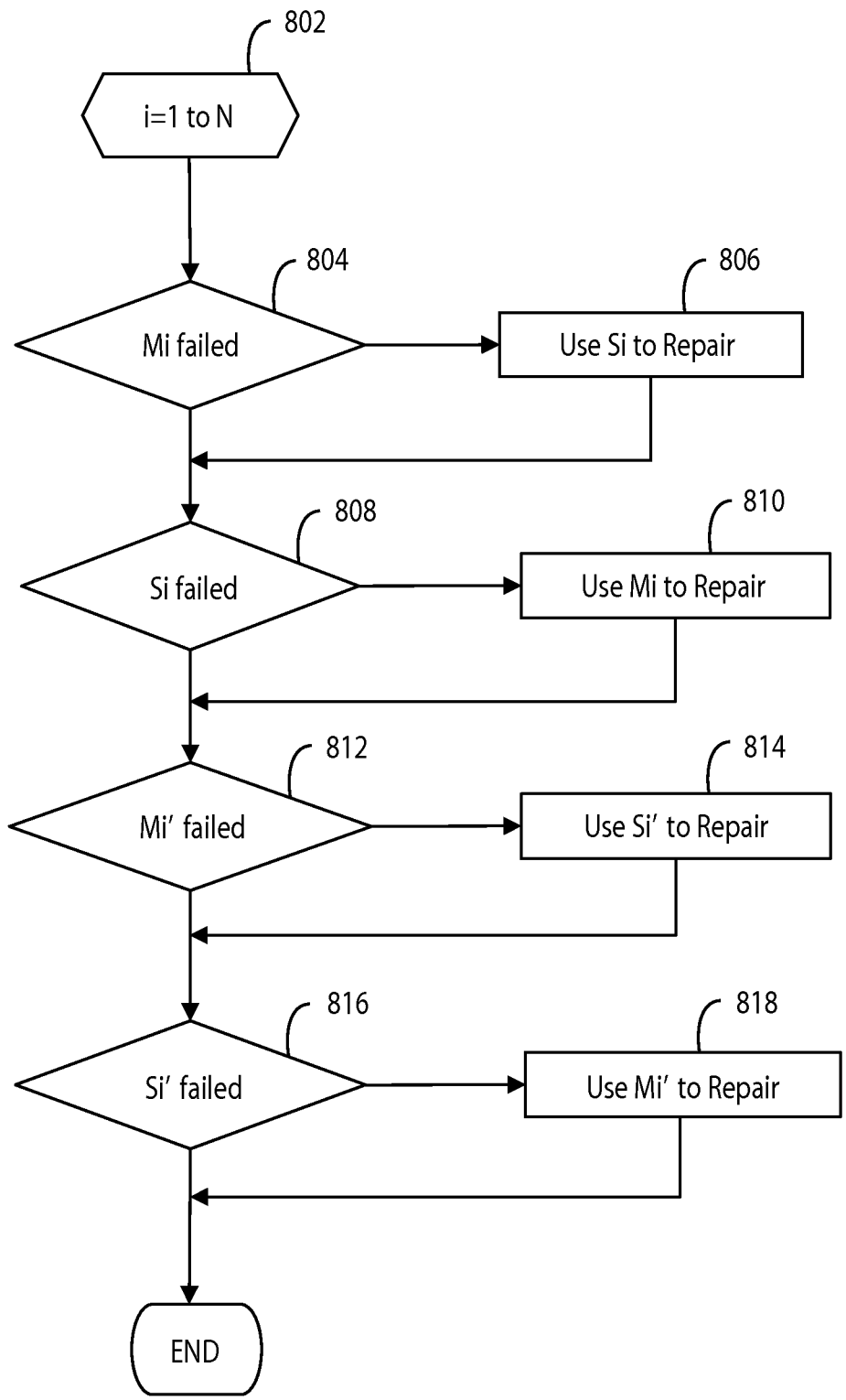
FIG. 8A is a flow chart of a repair method using the InFO wafer of FIG. 2.

FIG. 8A is a flow chart of the repair logic, according to some embodiments. This logic can be implemented in a processor programmed with software, or in special purpose hardware (application specific integrated circuit). FIG. 8A uses the nomenclature of FIG. 2, in which the master pads on die 110 are Mi, the slave pads on die 110 are Si, the master pads on die 150 are Mi' and the slave pads on die 150 are Si'. Paths are denoted by sending pad and receiving pad (e.g., Mi-Si).

At step 802, a loop including steps 804-818 is performed N times, where N is the number of BSC in each node. For example, in the configuration of FIG. 2, the loop is performed 10 times.

At step 804, if the master path Mi-Si' from die 110 to die 150 is failed, then step 806 is performed. Otherwise, step 806 is skipped.

At step 806, the demultiplexer controller 182 is programmed to use the slave path Si-Mi' instead of the master path Mi-Si' to send data from die 110 to die 150.

At step 808, if the slave path Si-Mi' from die 110 to die 150 is failed, then step 810 is performed. Otherwise, step 810 is skipped.

At step 810, the demultiplexer controller 182 is programmed to use the master path Mi-Si' instead of the slave path Si-Mi' to send data from die 110 to die 150.

At step 812, if the master path Mi'-Si from die 150 to die 110 is failed, then step 814 is performed. Otherwise, step 814 is skipped.

At step 814, the demultiplexer controller 182 is programmed to use the slave path Si'-Mi instead of the master path Mi'-Si.

At step 816, if the slave path Si'-Mi from die 150 to die 110 is failed, then step 818 is performed. Otherwise, step 818 is skipped.

At step 818, the demultiplexer controller 182 is programmed to use the master path Mi'-Si instead of the slave path Si'-Mi.

Figure 8B:
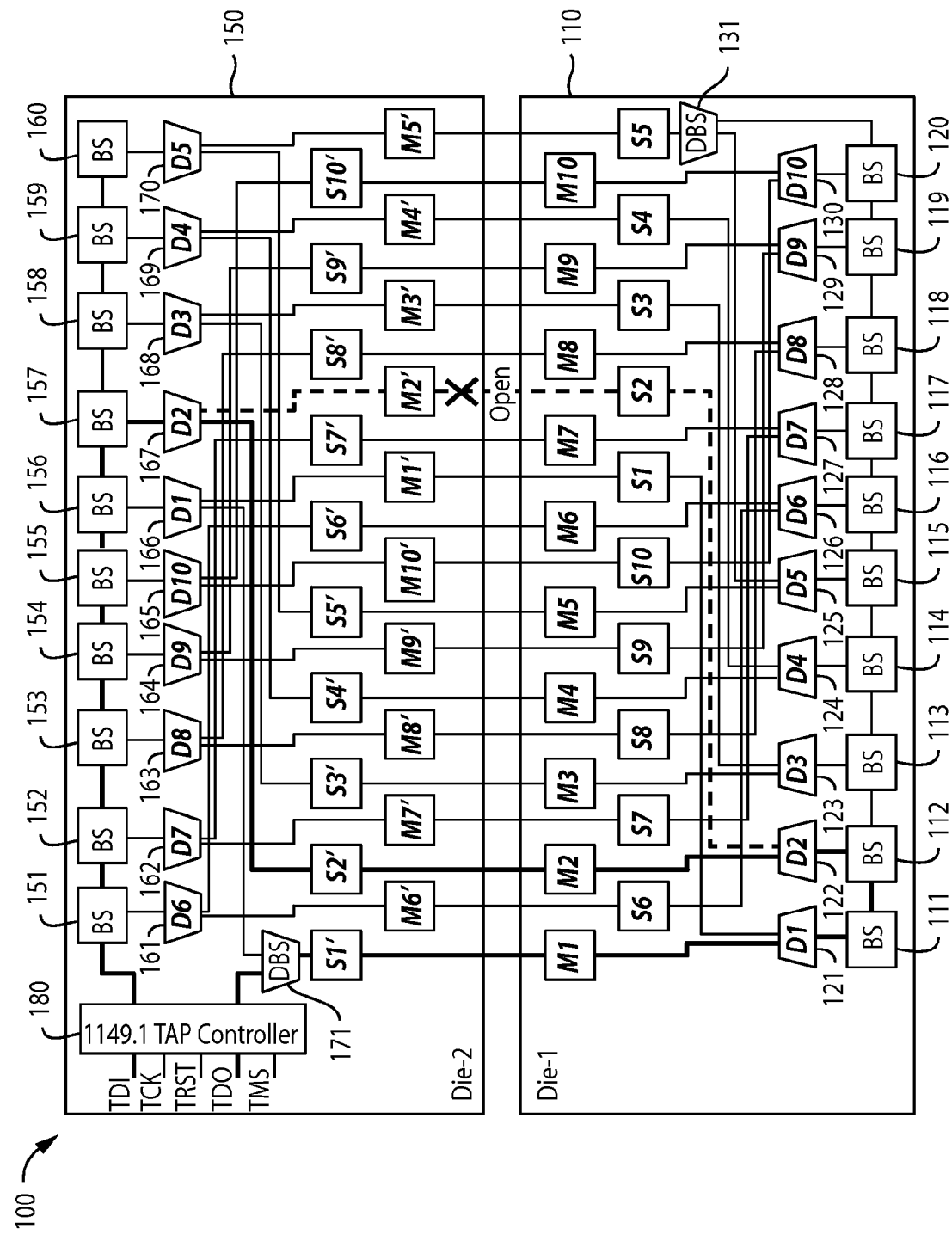
FIG. 8B shows an example of a repair using the method of FIG. 8A.

FIG. 8B shows an example of a repair as described above with reference to FIG. 8A. The testing, determines that there is an open circuit between BSC 112 and BSC 157, indicated by the dashed line. The problem is identified as a failure of the master path M2'-S2 connecting pads M2' and S2. Upon execution of the method of FIG. 8A, at steps 812 and 814, the demultiplexer controller 182 is programmed to use the slave path S2'-M2 instead of the master path M2'-S2. Thereafter, path S2'-M2 is used. The repair can be verified by transmitting data through a loop highlighted in FIG. 8B, including input terminal TDI, BSC 151-157, demultiplexer D2 167, pad S2', pad M2, demultiplexer D2 122, BSC 112, BSC 111 demultiplexer 121, pad M1, Pad S1', demultiplexer 171 and output terminal TDO.

In some embodiments, a fan-out wafer comprises a first IC die having at least a first boundary scan cell (BSC) and a second BSC. The first BSC is coupled to a first demultiplexer. The second BSC is coupled to a first pad. A second IC die has at least a third BSC coupled to a second demultiplexer, and a second pad connected to the first pad. A first master path connects the first demultiplexer to the second demultiplexer. A first slave path connects the first demultiplexer to the second demultiplexer. The first pad and second pad are located between the first master path and the first slave path.

In some embodiments, the first demultiplexer is configurable to select one of the first master path or the first slave path for transmission of a signal from the first BSC to the third BSC.

In some embodiments the first pad is included in a plurality of pads arranged in a row, the row including a third pad adjacent to the first pad and a spacing between a closest pair of respective edges of the first pad and the third pad is smaller than a width of the first pad in a direction extending from the first pad to the third pad.

In some embodiments, the first master path includes a first master pad on the first die connected to a first slave pad on the second die, the first master pad and the first slave pad connected between the first demultiplexer and the second demultiplexer; and the first slave path includes a second slave pad on the first die connected to a second master pad on the second die, the second slave pad and the second master pad connected between the first demultiplexer and the second demultiplexer.

In some embodiments, the first master pad is included in a first row of master pads on the first die; the second slave pad is included in a first row of slave pads on the first die; and the first row of slave pads is parallel to the first row of master pads.

In some embodiments, the first row of slave pads is offset from the first row of master pads, in a direction extending parallel to the first row of master pads, by an amount that is approximately half of a pitch between adjacent master pads.

Some embodiments further comprise at least one redistribution layer formed above the first die and above the second die, wherein the first master path and the first slave path each include at least one conductive line in the at least one redistribution layer.

In some embodiments, a fan-out wafer comprises a first IC die having a plurality of boundary scan cells (BSC) and a plurality of demultiplexers, each BSC coupled to a respective one of the demultiplexers, each demultiplexer coupled to a respective master pad on the first die and to a respective slave pad on the first die. A second IC die has a plurality of BSC and a plurality of demultiplexers, each BSC coupled to a respective one of the demultiplexers, each demultiplexer coupled to a respective master pad on the second die and to a respective slave pad on the second die. Each master pad of the first die is connected to a respective slave pad of the second die. Each master pad of the second die is connected to a respective slave pad of the first die. The respective master pad and slave pad corresponding to each respective demultiplexer of the first die are separated from each other by at least one line connected to the master pad or slave pad corresponding to another one of the demultiplexers of the first die.

In some embodiments, each demultiplexer of the first die is configurable to select one of a respective master path including the master pad corresponding to that demultiplexer or a respective slave path including the slave pad corresponding to that demultiplexer, for transmission of a signal from the BSC coupled to that demultiplexer to a BSC on the second die.

In some embodiments, each first master pad on the first die is included in a first row of master pads. Each slave pad on the first die is included in a first row of slave pads. The first row of slave pads is parallel to the first row of master pads.

In some embodiments, each slave pad in the first row of slave pads is offset from a nearest master pad in the first row of master pads, along a length direction of the first row of master pads.

Some embodiments further comprise a respective additional demultiplexer on each of the first and second IC dies, for selectably forming a boundary scan test loop that includes all of the BSC of the first IC die and all of the BSC of the second IC die.

Some embodiments further comprise a first redistribution layer having a first conductive line coupled between a first one of the demultiplexers on the first IC die and a first one of the demultiplexers on the second IC die; and a second redistribution layer having a second conductive line coupled between the first demultiplexer on the first IC die and the first demultiplexer on the second IC die.

In some embodiments, a test method comprises: shifting first data into a first plurality of boundary scan cells (BSC) in a first die of a fan-out wafer; configuring each one of a plurality of demultiplexers to select either a respective master path or a respective slave path for outputting data from a respective one of the plurality of BSC; shifting the first data into a second plurality of BSC in a second die via the selected paths; configuring an additional demultiplexer on each of the first and second dies to form a single loop including the first and second pluralities of BSC; and shifting second data through each BSC in the loop.

In some embodiments, the step of shifting the second data include inputting the second data sequentially into a first terminal in one of the first die or the second die, and outputting the second data sequentially from a second terminal in the same one of the first die or the second die.

In some embodiments, the first plurality of BSC are arranged in a first row. The first row includes a first BSC coupled to the first terminal and a first one of the additional demultiplexers coupled to the second terminal.

In some embodiments, the second plurality of BSC are arranged in a second row. The second row includes a first BSC coupled to the first additional demultiplexer and a last BSC coupled to the second additional demultiplexer.

Some embodiments further comprise detecting that a master path corresponding to one of the first plurality of demultiplexers has failed; and switching that demultiplexer to select the corresponding slave path coupled to that one demultiplexer for outputting data.

In some embodiments, the master path corresponding to the one demultiplexer is on a first redistribution layer, the slave path corresponding to the one demultiplexer is on a second redistribution layer.

Some embodiments further comprise: shifting third data into the second plurality of BSC; configuring each one of a plurality of demultiplexers to select either a respective master path or a respective slave path for outputting data from a respective one of the second plurality of BSC; and shifting the third data into the first plurality of BSC via the selected paths.

The methods and system described herein may be at least partially embodied in the form of computer-implemented processes and apparatus for practicing those processes. The disclosed methods may also be at least partially embodied in the form of tangible, non-transitory machine readable storage media encoded with computer program code. The media may include, for example, RAMs, ROMs, CD-ROMs, DVD-ROMs, BD-ROMs, hard disk drives, flash memories, or any other non-transitory machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A fan-out wafer comprising:
a first IC die having at least a first boundary scan cell (BSC) and a second BSC, the first BSC coupled to a first demultiplexer, the second BSC coupled to a first pad;
a second IC die having at least a third BSC coupled to a second demultiplexer, and a second pad connected to the first pad;

a first master path connecting the first demultiplexer to the second demultiplexer; and a first slave path connecting the first demultiplexer to the second demultiplexer, wherein the first pad and the second pad are located between the first master path and the first slave path, wherein the first master path includes a first master pad on the first die connected to a first slave pad on the second die, the first master pad and the first slave pad connected between the first demultiplexer and the second demultiplexer; and the first slave path includes a second slave pad on the first die connected to a second master pad on the second die, the second slave pad and the second master pad connected between the first demultiplexer and the second demultiplexer.

2. The fan-out wafer of claim 1, wherein the first demultiplexer is configurable to select one of the first master path or the first slave path for transmission of a signal from the first BSC to the third BSC.

3. The fan-out wafer of claim 1, wherein:
the first pad is included in a plurality of pads arranged in a row, the row including a third pad adjacent to the first pad; and
a spacing between a closest pair of respective edges of the first pad and the third pad is smaller than a width of the first pad in a direction extending from the first pad to the third pad.

4. The fan-out wafer of claim 1, wherein:
the first master pad is included in a first row of master pads on the first die;
the second slave pad is included in a first row of slave pads on the first die; and
the first row of slave pads is parallel to the first row of master pads.

5. The fan-out wafer of claim 4, wherein the first row of slave pads is offset from the first row of master pads, in a direction extending parallel to the first row of master pads, by an amount that is less than or equal to half of a pitch between adjacent master pads.

6. The fan-out wafer of claim 1, further comprising at least one redistribution layer formed above the first die and above the second die, wherein the first master path and the first slave path each include at least one conductive line in the at least one redistribution layer.

7. A fan-out wafer comprising:
a first IC die having a plurality of boundary scan cells (BSC) and a plurality of demultiplexers, each BSC coupled to a respective one of the demultiplexers, each demultiplexer coupled to a respective master pad on the first die and to a respective slave pad on the first die; and
a second IC die having a plurality of BSC and a plurality of demultiplexers, each BSC coupled to a respective one of the demultiplexers, each demultiplexer coupled to a respective master pad on the second die and to a respective slave pad on the second die;
each master pad of the first die connected to a respective one of the slave pads of the second die;
each master pad of the second die connected to a respective one of the slave pads of the first die,
wherein each demultiplexer of the first die is configurable to select one of a respective master path including the master pad corresponding to that demultiplexer or a respective slave path including the slave pad corresponding to that demultiplexer, for transmission of a signal from the BSC coupled to that demultiplexer to a BSC on the second die.

8. The fan-out wafer of claim 7, wherein:
each master pad on the first die is included in a first row of master pads;
each slave pad on the first die is included in a first row of slave pads; and
the first row of slave pads is parallel to the first row of master pads.

9. The fan-out wafer of claim 7, wherein each slave pad in the first row of slave pads is offset from a nearest master pad in the first row of master pads, along a length direction of the first row of master pads.

10. The fan-out wafer of claim 7, further comprising a respective additional demultiplexer on each of the first IC die and the second IC die, for selectably forming a boundary scan test loop that includes all of the BSC of the first IC die and all of the BSC of the second IC die.

11. The fan-out wafer of claim 7, further comprising:
a first redistribution layer having a first conductive line coupled between a first one of the demultiplexers on the first IC die and a first one of the demultiplexers on the second IC die; and
a second redistribution layer having a second conductive line coupled between the first demultiplexer on the first IC die and the first demultiplexer on the second IC die.

12. A test method comprising:
shifting first data into a first plurality of boundary scan cells (BSC) in a first die of a fan-out wafer;
configuring each one of a plurality of demultiplexers to select either a respective master path or a respective slave path for outputting data from a respective one of the plurality of BSC;
shifting the first data into a second plurality of BSC in a second die via the one of the respective master path or the respective slave path selected for outputting data;
configuring a first additional demultiplexer on the first die and a second additional demultiplexer on the second die to form a single loop including the first plurality of BSC and the second plurality of BSC;
shifting second data through each BSC in the loop;
shifting third data into the second plurality of BSC;
configuring each one of the plurality of demultiplexers to select either a respective master path or a respective slave path for outputting data from a respective one of the second plurality of BSC; and
shifting the third data into the first plurality of BSC via the one of the respective master path or the respective slave path that has been selected.

13. The method of claim 12, wherein the step of shifting the second data include inputting the second data sequentially into a first terminal in one of the first die or the second die, and outputting the second data sequentially from a second terminal in the same one of the first die or the second die.

14. The method of claim 13, wherein:
the first plurality of BSC are arranged in a first row; and
the first row includes a first BSC coupled to the first terminal and the first additional demultiplexer coupled to the second terminal.

15. The method of claim 14, wherein:
the second plurality of BSC are arranged in a second row; and
the second row includes a first BSC coupled to the first additional demultiplexer and a last BSC coupled to the second additional demultiplexer.

16. The method of claim 12, further comprising:
detecting that a master path corresponding to one of the first plurality of demultiplexers has failed; and switching that demultiplexer to select one of the slave paths, corresponding to the master paster path that has failed for outputting data, the slave path corresponding to the master paster path that has failed being coupled to said one of the plurality of demultiplexers.

17. The method of claim 16, wherein:
the master path corresponding to the demultiplexer to which the master path that has failed corresponds is on a first redistribution layer; and
the slave path corresponding to the one demultiplexer is on a second redistribution layer.

18. The fan-out wafer of claim 1, further comprising a second master path including a third master pad on the first die connected to a third slave pad on the second die, the second master pad and the second slave pad connected by a line located between the first master pad and the third master pad.

19. The fan-out wafer of claim 18, further comprising a second slave path including a fourth slave pad on the first die connected to a fourth master pad on the second die, the third master pad connected to a line located between the second slave pad and the fourth slave pad.

20. The fan-out wafer of claim 7, wherein the respective master pad and slave pad corresponding to each respective demultiplexer of the first die are separated from each other by at least one line connected to the master pad or slave pad corresponding to another one of the demultiplexers of the first die.

* * * * *